(12) United States Patent
Liang et al.

(10) Patent No.: US 7,998,765 B2
(45) Date of Patent: Aug. 16, 2011

(54) METHOD FOR FORMING AN LED LENS STRUCTURE AND RELATED STRUCTURE

(75) Inventors: Chih-Lung Liang, Taipei (TW); Yuan-Fu Chen, Hsinchu (TW)

(73) Assignee: Lite-On Technology Corp., Taipei (TW)

( * ) Notice: Subject to any disclaimer, the term of this patent is extended or adjusted under 35 U.S.C. 154(b) by 165 days.

(21) Appl. No.: 12/543,483

(22) Filed: Aug. 18, 2009

(65) Prior Publication Data

US 2010/0252848 A1 Oct. 7, 2010

(30) Foreign Application Priority Data

Apr. 1, 2009 (TW) ................................ 98110858 A

(51) Int. Cl.
*H01L 33/48* (2010.01)
(52) U.S. Cl. ...... 438/26; 257/98; 257/687; 257/E21.499
(58) Field of Classification Search .................. None
See application file for complete search history.

(56) References Cited

U.S. PATENT DOCUMENTS

| 7,268,368 | B1 * | 9/2007 | Knapp | 257/80 |
|---|---|---|---|---|
| 2006/0157828 | A1 * | 7/2006 | Sorg | 257/666 |
| 2007/0121326 | A1 * | 5/2007 | Nall et al. | 362/294 |
| 2008/0044934 | A1 * | 2/2008 | Loh et al. | 438/21 |
| 2008/0253104 | A1 * | 10/2008 | Inui | 361/813 |
| 2009/0087931 | A1 * | 4/2009 | Lee et al. | 438/26 |
| 2009/0136179 | A1 * | 5/2009 | Kim et al. | 385/33 |

* cited by examiner

*Primary Examiner* — N Drew Richards
*Assistant Examiner* — Peter Bradford
(74) *Attorney, Agent, or Firm* — Kile Goekjian Reed & McManus PLLC

(57) ABSTRACT

A method for manufacturing an LED lens structure includes the following steps of disposing a lead frame with the LED chip into a mold, and injecting thermoplastic transparent material to a plane of the lead frame which is different from a plane that LED chip is mounted thereon to form a lens structure corresponding to the LED chip.

9 Claims, 20 Drawing Sheets

METHOD FOR FORMING AN LED LENS STRUCTURE AND RELATED STRUCTURE

BACKGROUND OF THE INVENTION

1. Field of the Invention

The present invention relates to a manufacturing method and related structures, and more specifically, to a manufacturing method for forming LED lens structures and related structures, in which LED chips and the wire thereon may be protected from damage caused by direct scouring of thermoplastic transparent material.

2. Description of the Prior Art

In recent years, light emitting diodes (LEDs) have begun to play an important role as a light source in a backlight of an LCD panel. Thus, physical characteristics and packaging processes of the LED need to be further improved for meeting various application needs. For example, disposing or forming the condensing lens on an LED chip is popularly used for increasing the light density or the visual angle variation of the LED.

In general, the said condensing lens is made of silicone material. However, in an LED lens forming process, the slow flow of the melted silicone material in a mold is resulted in a long process time for forming the LED lens.

In addition, if the said disposal of the condensing lens above the LED chip is utilized, an additional assembly step may be needed in an LED packaging process. Thus, not only may the LED packaging process be more complicated, but manufacturing cost of the LED may also be increased.

Thus, how to reduce cost and time needed for forming the LED lens may be a concern in an LED packaging process design.

SUMMARY OF THE INVENTION

The present invention provides a method for manufacturing an LED lens structure, especially on using an injection molding process for forming a lens structure covering the LED chip.

The present invention further provides an LED device comprising an LED lens structure according to the above-mentioned manufacturing method.

Furthermore, the present invention provides an LED module having a plurality of lens structures formed above a plurality of LED chips respectively and a plurality of fixing structures used for fixing the plurality of lens structures on a lead frame or a plurality of reflective cups by receiving thermoplastic transparent material from a gate of a mold using an injection molding process.

These and other objectives of the present invention will no doubt become obvious to those of ordinary skill in the art after reading the following detailed description of the preferred embodiment that is illustrated in the various figures and drawings.

DETAILED DESCRIPTION

Methods for forming an LED lens structure and related structures provided by the present invention may be applied to an LED light bar and one single LED. At first, an LED light bar with a plurality of LEDs is taken as an example for detailed description of manufacturing methods and structural designs mentioned in the present invention.

Figure 1:
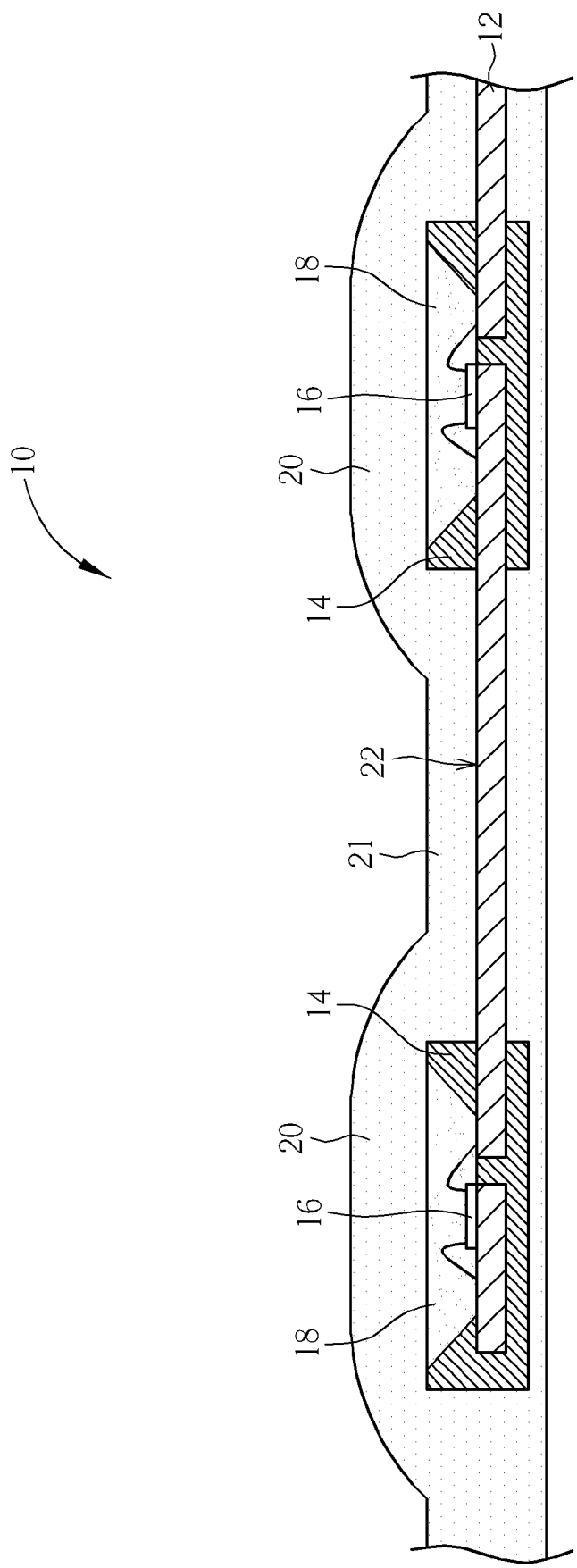
FIG. 1 is a partial cross-sectional diagram of an LED module according to a first preferred embodiment of the present invention.

Please refer to FIG. 1, which is a partial cross-sectional diagram of an LED module 10 according to a first preferred embodiment of the present invention. The LED module 10 includes a lead frame 12, a plurality of reflection cup structures 14, a plurality of LED chips 16, a plurality of glue layers 18, a plurality of lens structures 20, and a plurality of fixing structures 21. After the LED module 10 is formed by an injection molding process, the lens structures 20 and the fixing structures 21 cover the lead frame 12 so that the lens structures 20 and the fixing structures 21 may be fixed to the lead frame 12 together.

Figure 7:
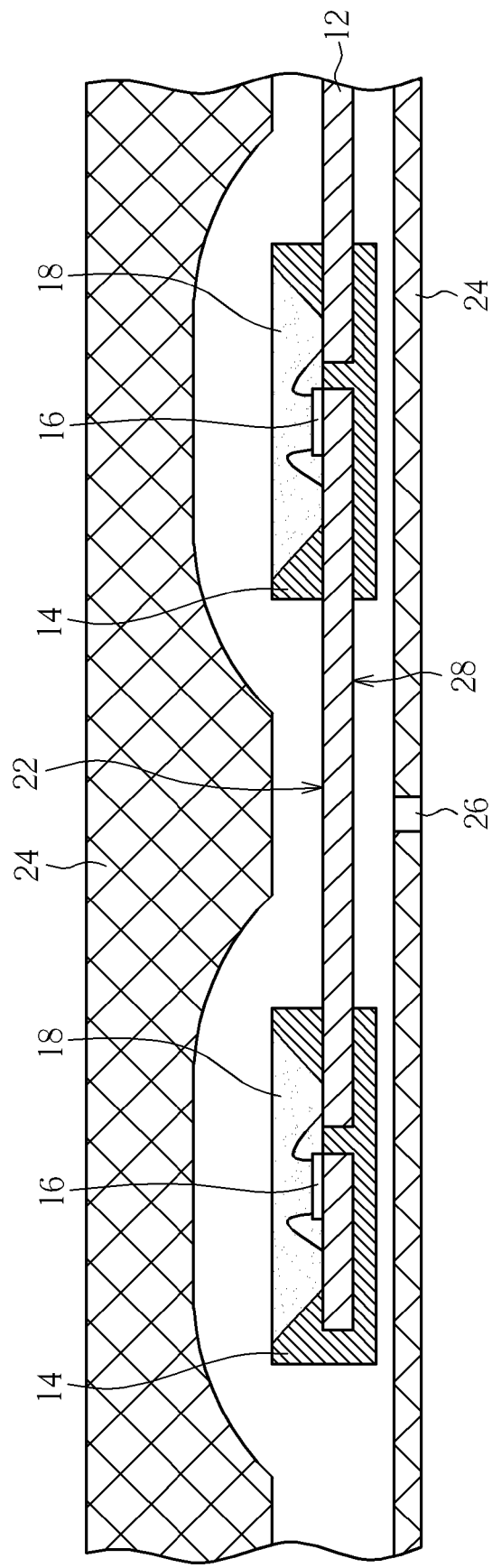
FIG. 7 is a partial cross-sectional diagram of the lead frame in FIG. 6 with the plurality of LED chips being disposed in a mold.
Figure 8:
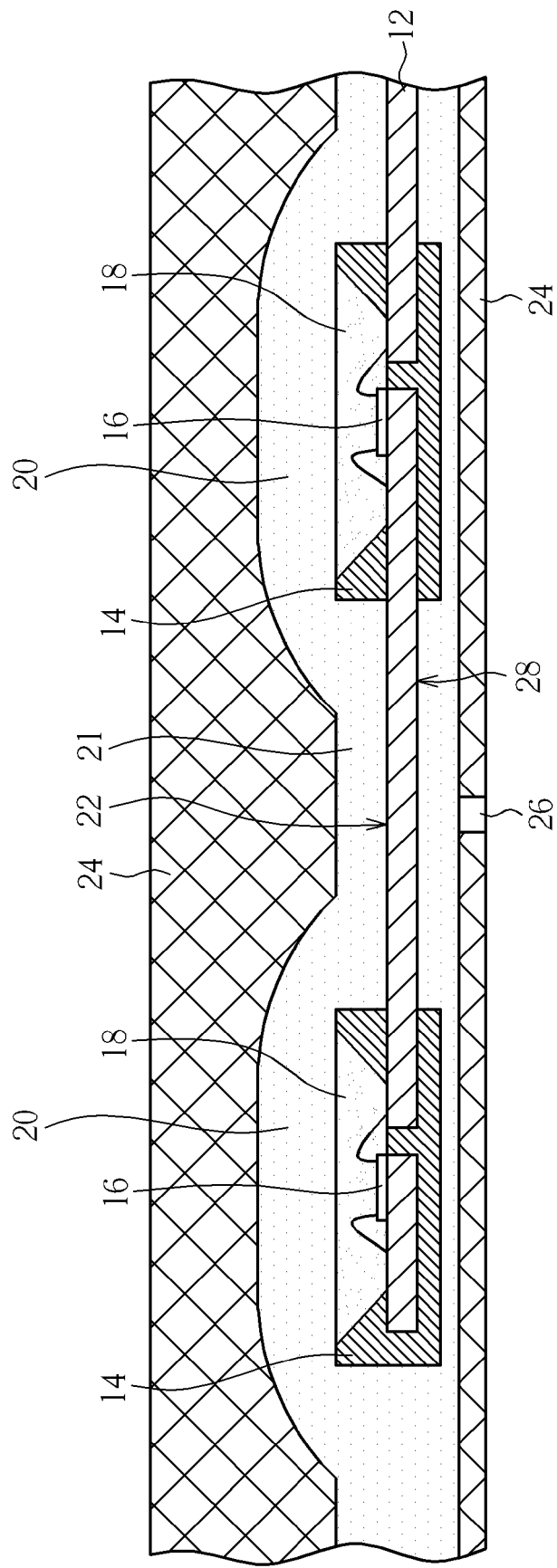
FIG. 8 is a partial cross-sectional diagram of lens structures and fixing structures being formed in the mold in FIG. 7.

Briefly, as shown in FIG. 8, a mold 24 as shown in FIG. 7 may be utilized to form the lens structure 20 on the glue layer 18 and form the fixing structure 21 between two adjacent reflection cup structures 14, so that the lens structure 20 and the fixing structure 21 may cover the lead frame 12 cooperatively. In other words, the plurality of lens structures 20 and the plurality of fixing structures 21 are utilized to cover the plurality of reflection cup structures 14, the plurality of glue layers 18, and the lead frame 12. It should be noted that thermoplastic transparent material (i.e. material for forming the lens structures 20) needs to be injected to a reverse plane of the lead frame 12 (a plane without the LED chips 16) in the present invention. In such a manner, the lens structures 20 may be accordingly formed above the LED chips 16 without additional installation. Furthermore, the LED chips 16 and the related circuits (such as wire thereon) may also be protected from damage caused by the related lens molding process.

For increasing brightness of light generated by the LED chips 16, the plurality of reflection cup structures 14 is disposed on the lead frame 12. As shown in FIG. 1, each reflection cup structure 14 is disposed at a distance from each other on the lead frame 12. The plurality of LED chips 16 is respectively disposed in the plurality of reflection cup structures 14 and is electrically connected to a first plane 22 of the lead frame 12. The plurality of glue layers 18 is respectively formed in the plurality of reflection structures 14 and respectively covers the plurality of LED chips 16. The plurality of glue layers 18 is preferably made of epoxy or silicone material. The glue layers 18 may be omissible parts in the LED module 10. More detailed description for the LED module 10 is provided as follows.

Figure 2:
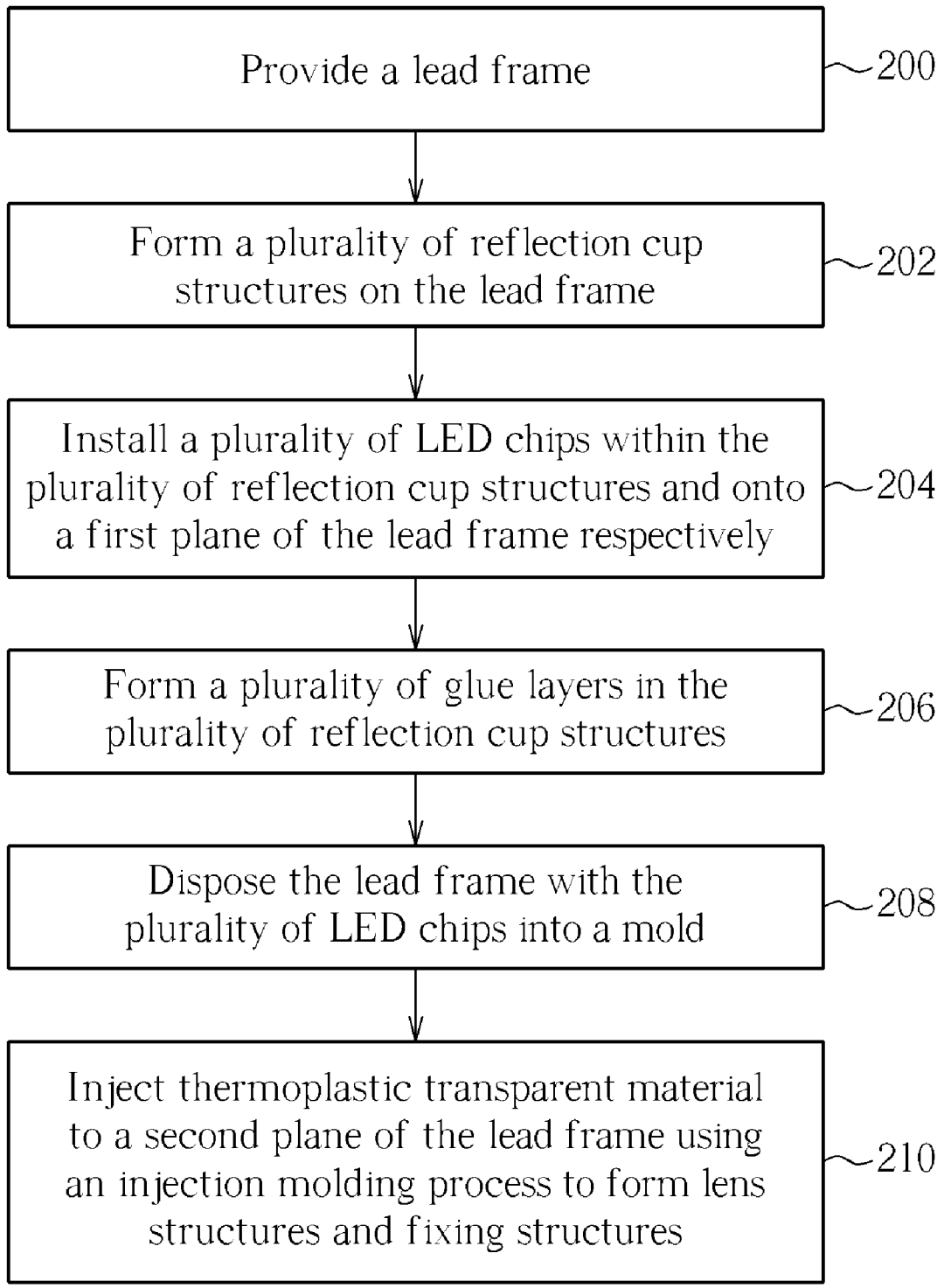
FIG. 2 is a flowchart of a method for forming the LED module according to the first preferred embodiment of the present invention.
Figure 3:
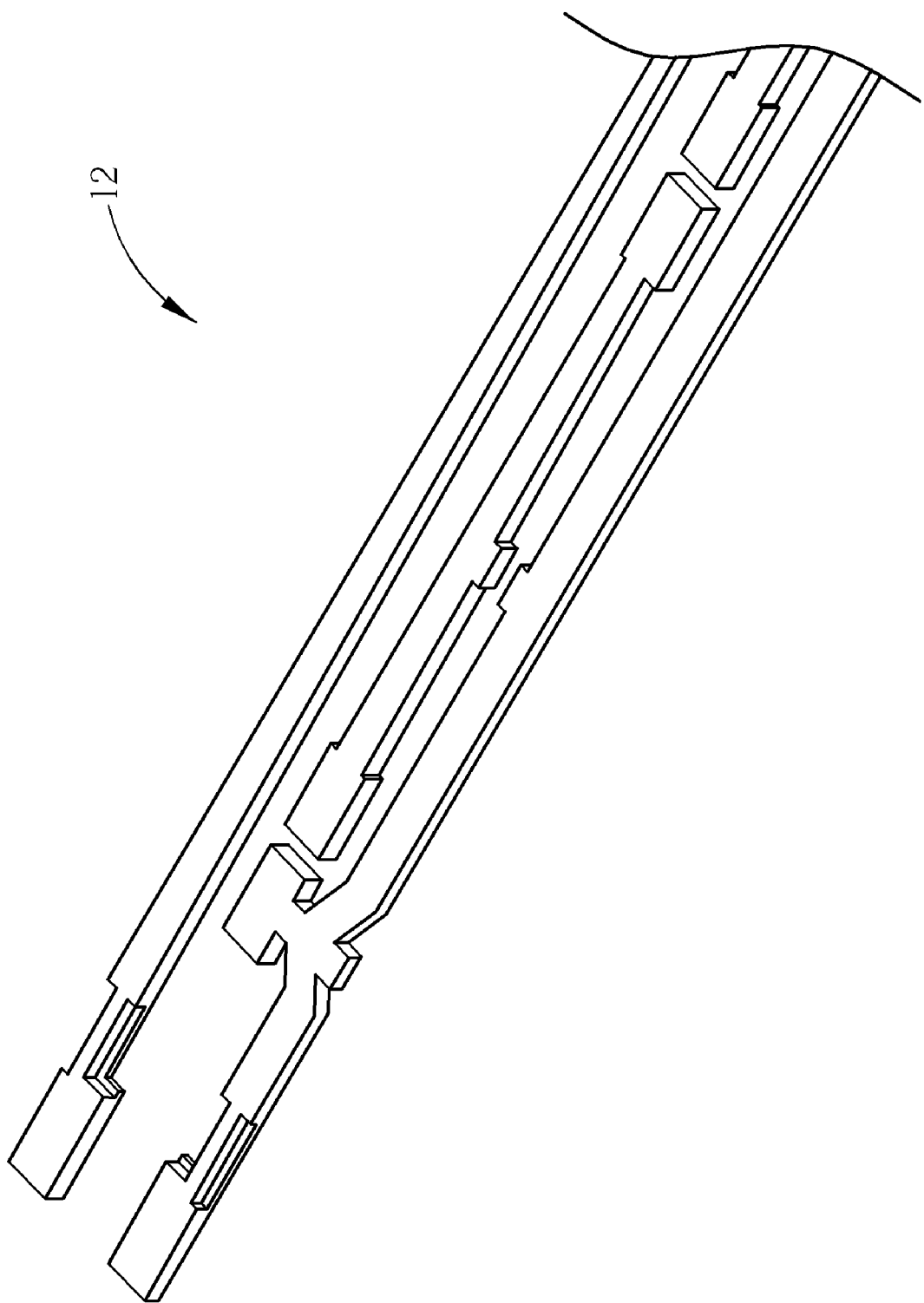
FIG. 3 is a partial diagram of a lead frame in FIG. 1.

Please refer to FIG. 2 and FIG. 3. FIG. 2 is a flowchart of a method for forming the LED module 10 according to the first preferred embodiment of the present invention. FIG. 3 is a partial diagram of the lead frame 12 in FIG. 1. The method involves packaging the plurality of LED chips 16 on the lead frame 12 and then respectively forming the plurality of lens structures 20 on the plurality of glue layers 18. The lead frame 12 mentioned in Step 200 is depicted in FIG. 3. The lead frame 12 is used to connect the plurality of LED chips 16 to an external circuit board for performing subsequent operations of the plurality of LED chips 16, such as light emitting control of the plurality of LED chips 56 or power supply for the plurality of LED chips 56. A method for forming the lead frame 12 can be a chemical etching method or a mechanical punching method. The chemical etching method involves utilizing a mask to form a corresponding pattern on lead frame material (e.g. copper alloy, iron-nickel alloy, etc.) and then utilizing an etching process to form the lead frame 12. The mechanical punching method involves utilizing a mold to perform a punching process on a metal board for forming the lead frame 12. In the present invention, the forming process of the lead frame 12 is preferably a mechanical punching process.

Figure 4:
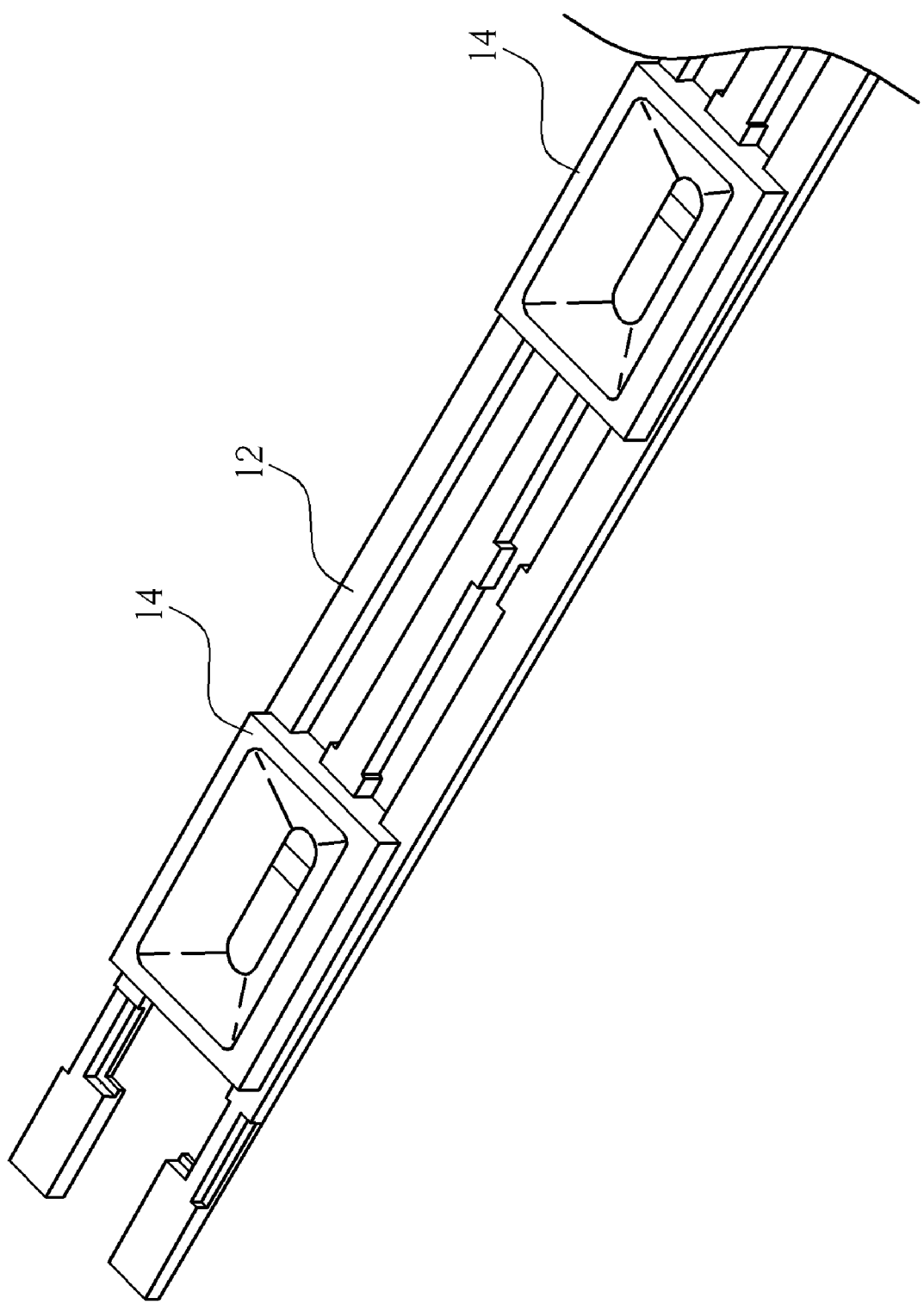
FIG. 4 is a partial diagram of reflection cup structures being formed on the lead frame in FIG. 3.

Next, please refer to FIG. 2 and FIG. 4 which is a partial diagram of the plurality of reflection cup structures 14 being formed on the lead frame in FIG. 3. In the LED module 10, the reflection cup structure 14 disposed around the LED chip 16 may reflect incident light for adjusting emitting angle of the LED chip 16 and increasing light intensity of the LED chip 16. As shown in FIG. 4, after the lead frame 12 is formed by a mechanical punching process, the plurality of reflection cup structures 14 is formed around the lead frame 12 by an injection molding process. The forming principle of the injection molding process is described as follows. The injection molding process involves adding a fixed quantity of plastic particles into a feeding funnel periodically and then sending the plastic particles into a heating pipe so as to melt the plastic particles. Subsequently, a piston is utilized to push the melted plastic particles to pass through a nozzle and then inject them into a mold through the nozzle. After the mold is filled with the melted plastic particles, a cooling system is utilized to solidify the melted plastic particles so as to form a finished product. In summary, compared with the transfer molding process, in which melted material flows slowly, the injection molding process may utilize a piston to inject melted material into a mold so that time needed for forming a finished product may be reduced. As mentioned above, in the present invention, the first step is to dispose the lead frame 12 in a mold corresponding to the shape of the plurality of reflection cup structures 14. Subsequently, the plurality of reflection cup structures 14 may be formed in the mold and associated with the lead frame 12 according to the said injection molding process. It should be mentioned that the formed reflection cup structures 14 may partially cover the lead frame 12 so as to secure the plurality of reflection cup structures 14 on the lead frame 12 more firmly.

Figure 5:
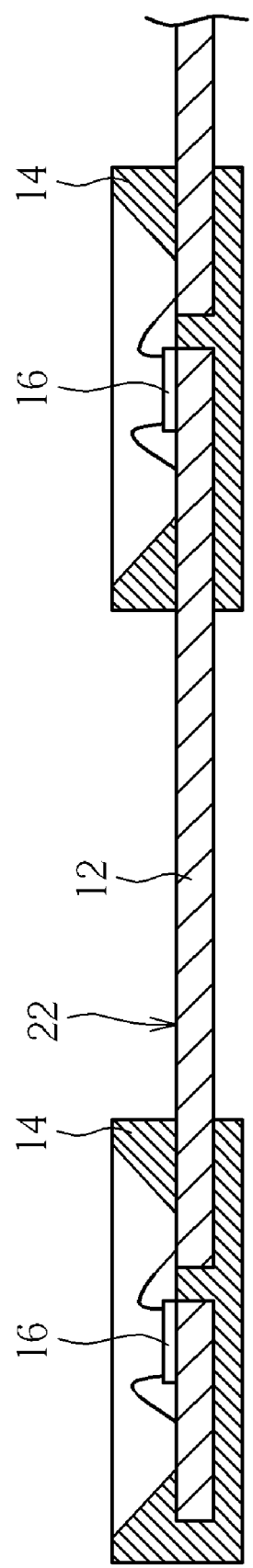
FIG. 5 is a partial cross-sectional diagram of LED chips being respectively installed within the reflection cup structures in FIG. 4.

Next, please refer to FIG. 2 and FIG. 5 which is a partial cross-sectional diagram of the plurality of LED chips 16 being installed within the plurality of reflection cup structures 14 respectively. As shown in FIG. 5, after the plurality of reflection cup structures 14 is formed on the lead frame 12 by the said injection molding process, the plurality of LED chips 16 is installed within the plurality of reflection cup structures 14 and onto the first plane 22 of the lead frame 12 respectively (Step 204). Furthermore, the method for installing the plurality of LED chips 16 within the plurality of reflection cup structures 14 also may include electrically connecting the plurality of LED chips 16 and the first plane 22 of the lead frame 12 respectively by a wire bonding process, a flip-chip process, etc.

Figure 6:
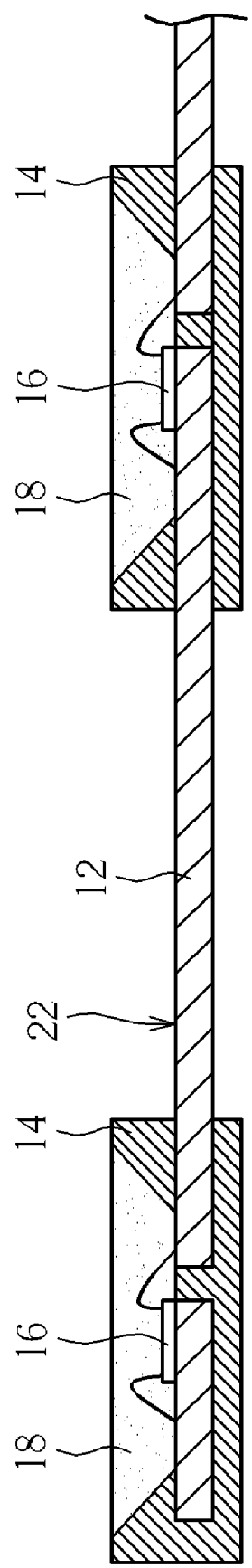
FIG. 6 is a partial cross-sectional diagram of glue layers being formed in the reflection cup structures in FIG. 5.

Next, please refer to FIG. 2 and FIG. 6 which is a partial cross-sectional diagram of the glue layers 18 being formed in the reflection cup structures 14 in FIG. 5. As shown in FIG. 6, the plurality of glue layers 18 is formed in the reflection cup structures 14, respectively (Step 206). In other words, transparent material (e.g. epoxy, silicone, etc.) is injected into each reflection cup structure 14 to form the corresponding glue layer 18 for packaging the LED chip 16 in the reflection cup structure 14. Furthermore, in the said process of injecting the transparent material, fluorescent powder may also be mixed into the transparent material for emitting light of specific wavelength. For example, YAG (Yttrium Aluminum Garnet, YAG) of fluorescent powder may be excited by blue light emitted from an LED chip to generate white light.

Next, please refer to FIG. 2 and FIG. 7 which is a partial cross-sectional diagram of the lead frame 12 with the LED chips 16 in FIG. 6 being disposed in the mold 24. As shown in FIG. 7, the lead frame 12 with the plurality of packaged LED chips 16 is disposed in the mold 24 (Step 208).

Next, the subsequent step is to perform the injection molding process. Please refer to FIG. 2 and FIG. 8 which is a partial cross-sectional diagram of the lens structures 20 and the fixing structures 21 being formed in the mold 24 in FIG. 7. As shown in FIG. 8, melted thermoplastic transparent material is injected to the second plane 28 of the lead frame 12 via a gate 26 of the mold 24 to fill with the mold 24. Thus, the lens structure 20 is accordingly formed on the glue layer 18 and the fixing structure 21 between adjacent reflection cup structures 14 (Step 210). In other words, the lens structures 20 and the fixing structures 21 are formed integrally and cover the lead frame 12 cooperatively. Finally, after drawing out the lead frame 12 with the lens structures 20 from the mold 24, the manufacturing process of the LED module 10 is completed. In addition, as shown in FIG. 7 and FIG. 8, the second plane 28 is (but is not limited to) a bottom plane of the lead frame 12. In the present invention, the melted thermoplastic transparent material may also be injected to another plane of the lead frame 12 different from the first plane 22. Thus, the LED chips 16 and the related circuits (such as wire thereon) may be protected from damage caused by direct scouring of the thermoplastic transparent material. In another embodiment of the present invention, the location of the gate 26 of the mold 24 may be changed to a side plane of the lead frame 12, which is located at a specific distance from the LED chips 16. In addition, the thermoplastic transparent material may also be injected via another injection gate opposite to the gate 26 of the mold 24. The injection gate needs to be close to the lead frame 12, and the distance between the injection gate and the first plane 22 of the lead frame 12 needs to be less than that between the reflection cup structure 14 and the first plane 22 of the lead frame 12. Furthermore, the thermoplastic transparent material mentioned in Step 212 is preferably polycarbonate material. As for the injection molding process mentioned in Step 210, the related description is omitted herein since it is similar to that mentioned in Step 202.

Figure 9:
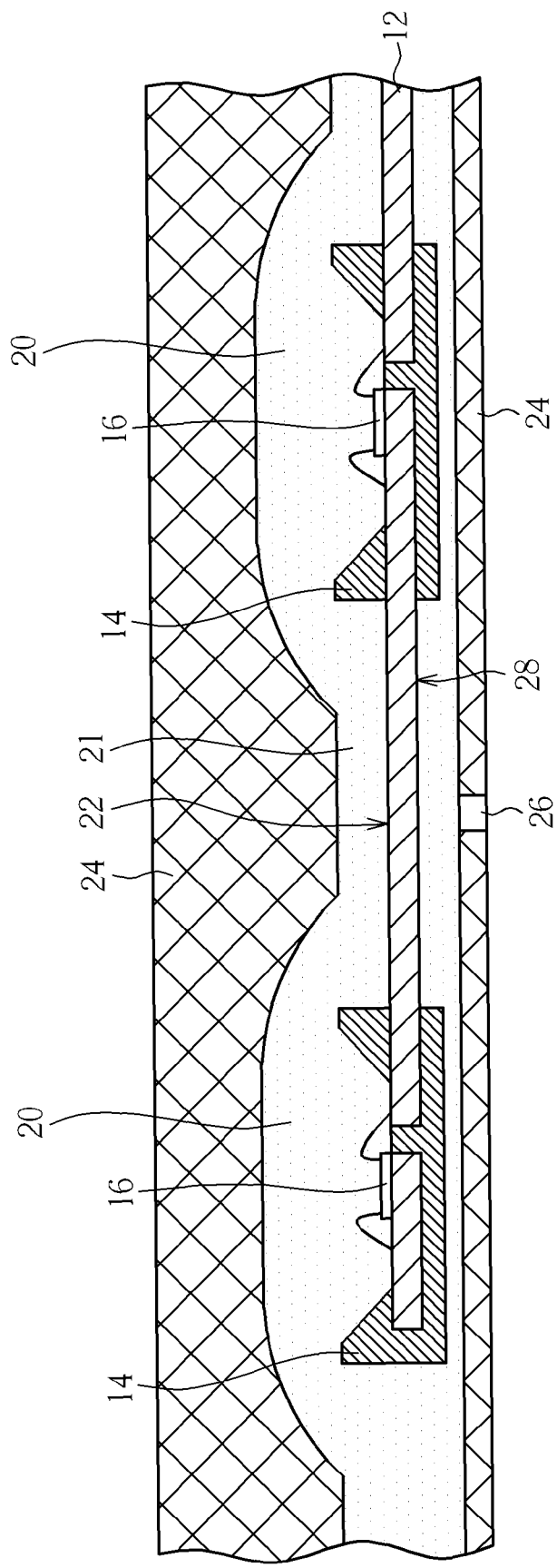
FIG. 9 is a partial cross-sectional diagram of the lens structures and the fixing structures covering the lead frame, the reflection cup structures, and the LED chips cooperatively.

It should be mentioned that Step 206 is an omissible step. Please refer to FIG. 9, which is a partial cross-sectional diagram of the lens structures 20 and the fixing structures 21 associating with the lead frame 12. In other words, the lens structures 20 and the fixing structures 21 cover the lead frame 12, the reflection cup structures 14, and the LED chips 16. After the plurality of LED chips 16 is installed within the plurality of reflection cup structures 14 of the lead frame 12 and onto the first plane 22 of the lead frame 12 respectively, the lead frame 12 with the plurality of LED chips 16 may be directly disposed in the mold 24 without performing Step 206, and Step 210 is then performed. In such a manner, as shown in FIG. 9, the plurality of LED chips 16 may be packaged in the plurality of reflection cup structures 14 of the lead frame 12 by the plurality of lens structures 20 respectively instead of the plurality of glue layers 18, so that the manufacturing process of the LED module 10 may be simplified and the related cost may also be reduced.

Figure 10:
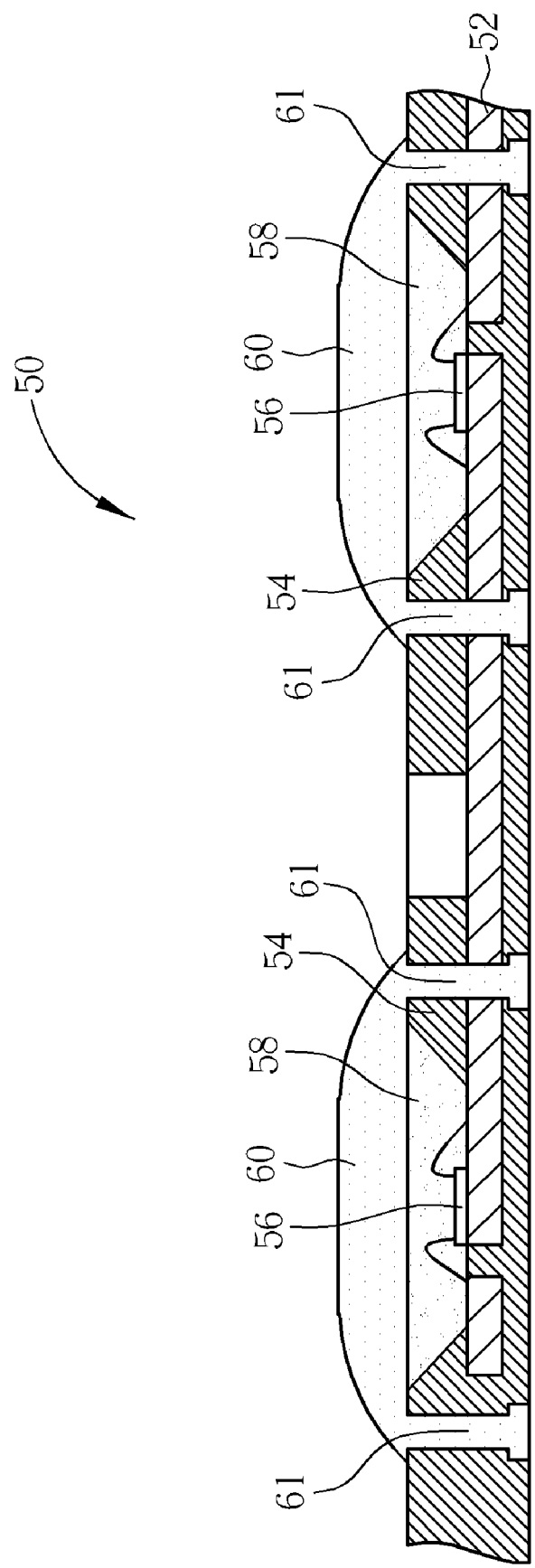
FIG. 10 is a partial cross-sectional diagram of the LED module according to a second preferred embodiment of the present invention.

Next, please refer to FIG. 10, which is a partial cross-sectional diagram of an LED module 50 according to a second preferred embodiment of the present invention. The LED module 50 includes a lead frame 52, a plurality of reflection cup structures 54, a plurality of LED chips 56, a plurality of glue layers 58, a plurality of lens structures 60, and a plurality of fixing structures 61. After an injection molding process, the LED module 50 is formed and each fixing structure 61 may pass through the lead frame 52 so as to secure the lens structures 60 to the lead frame 52. In the following, how the lens structures 60 and the fixing structures 61 associate with the lead frame 52 may be described in detail by a mold 66 as shown in FIG. 17.

Figure 17:
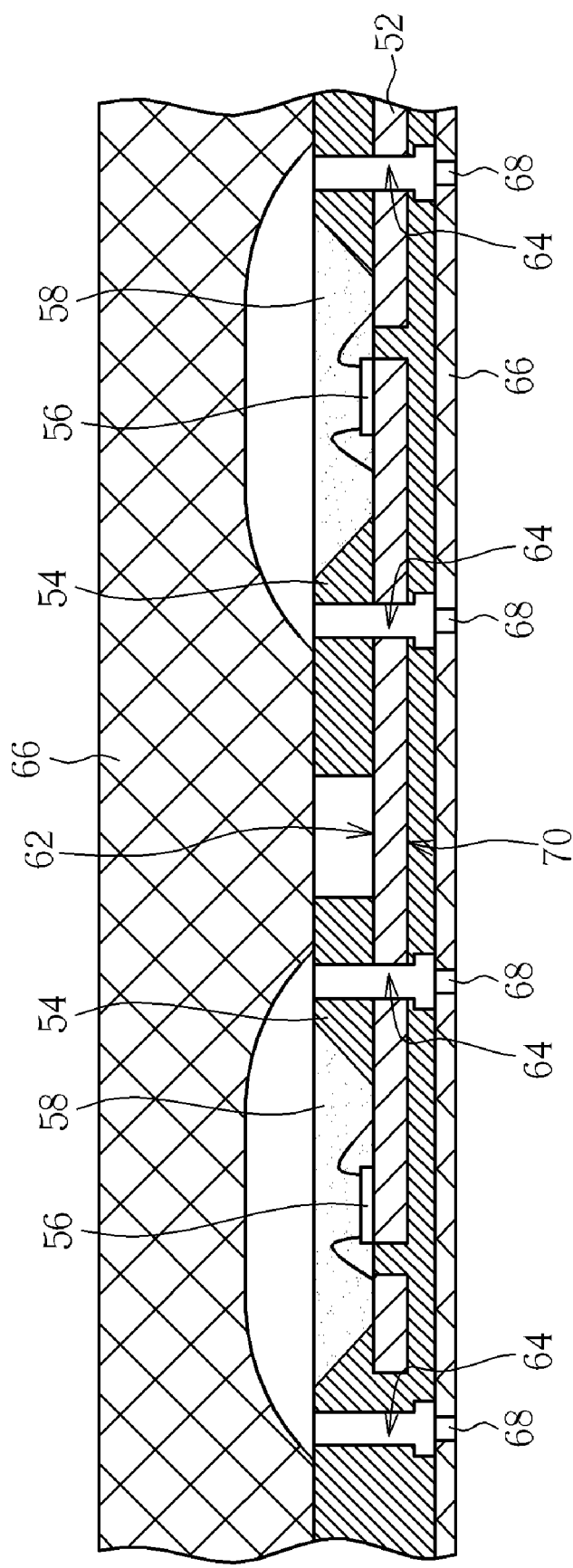
FIG. 17 is a partial cross-sectional diagram of the lead frame in FIG. 16 being disposed in a mold.

Briefly, as shown in FIG. 10, the mold 66 as shown in FIG. 17 is utilized to form the plurality of lens structures 60 and the plurality of fixing structures 61 integrally. It should be noted that thermoplastic transparent material (i.e. material for forming the lens structures 60) needs to be injected to a reverse plane of the lead frame 52 (a plane without the LED chips 56). In such a manner, the plurality of lens structures 60 may be accordingly formed above the plurality of LED chips 56 respectively without additional installation. Furthermore, the plurality of LED chips 56 and the related circuits (such as wire thereon) may also be protected from damage caused by the related lens molding process.

For increasing brightness of light generated by the plurality of LED chips 56, the plurality of reflection cup structures 54 is disposed on the lead frame 52. The plurality of LED chips 56 is disposed in the plurality of reflection cup structures 54 respectively and is electrically connected to the lead frame 52. The plurality of glue layers 58 is respectively formed in the plurality of reflection cup structures 54 and respectively covers the plurality of LED chips 56. The plurality of glue layers 58 is preferably made of epoxy or silicone material. The glue layers 58 are omissible parts in the LED module 50. Next, more detailed description for the LED module 50 is provided as follows.

Figure 11:
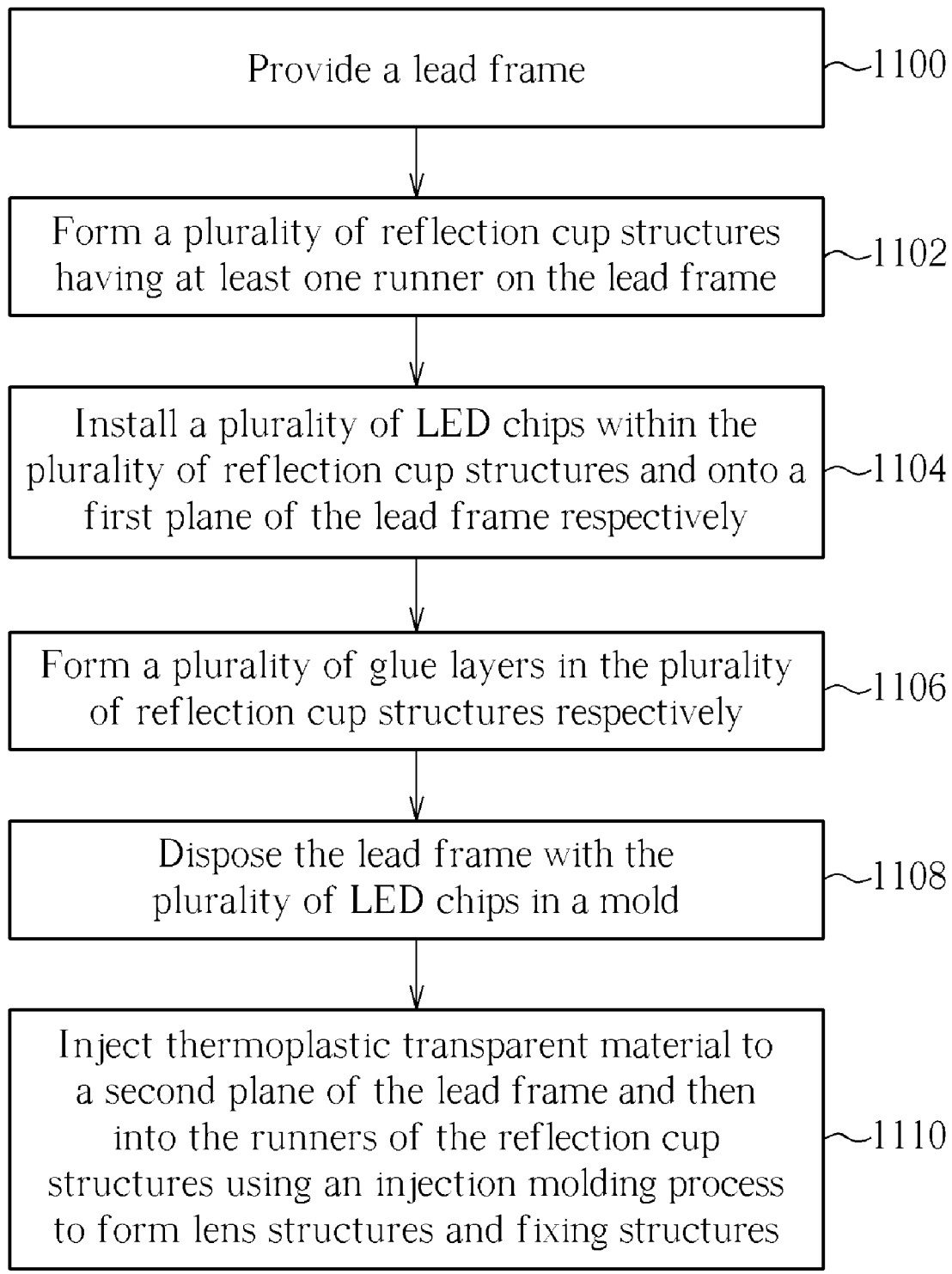
FIG. 11 is a flowchart of a method for forming an LED module according to the second preferred embodiment of the present invention.
Figure 12:
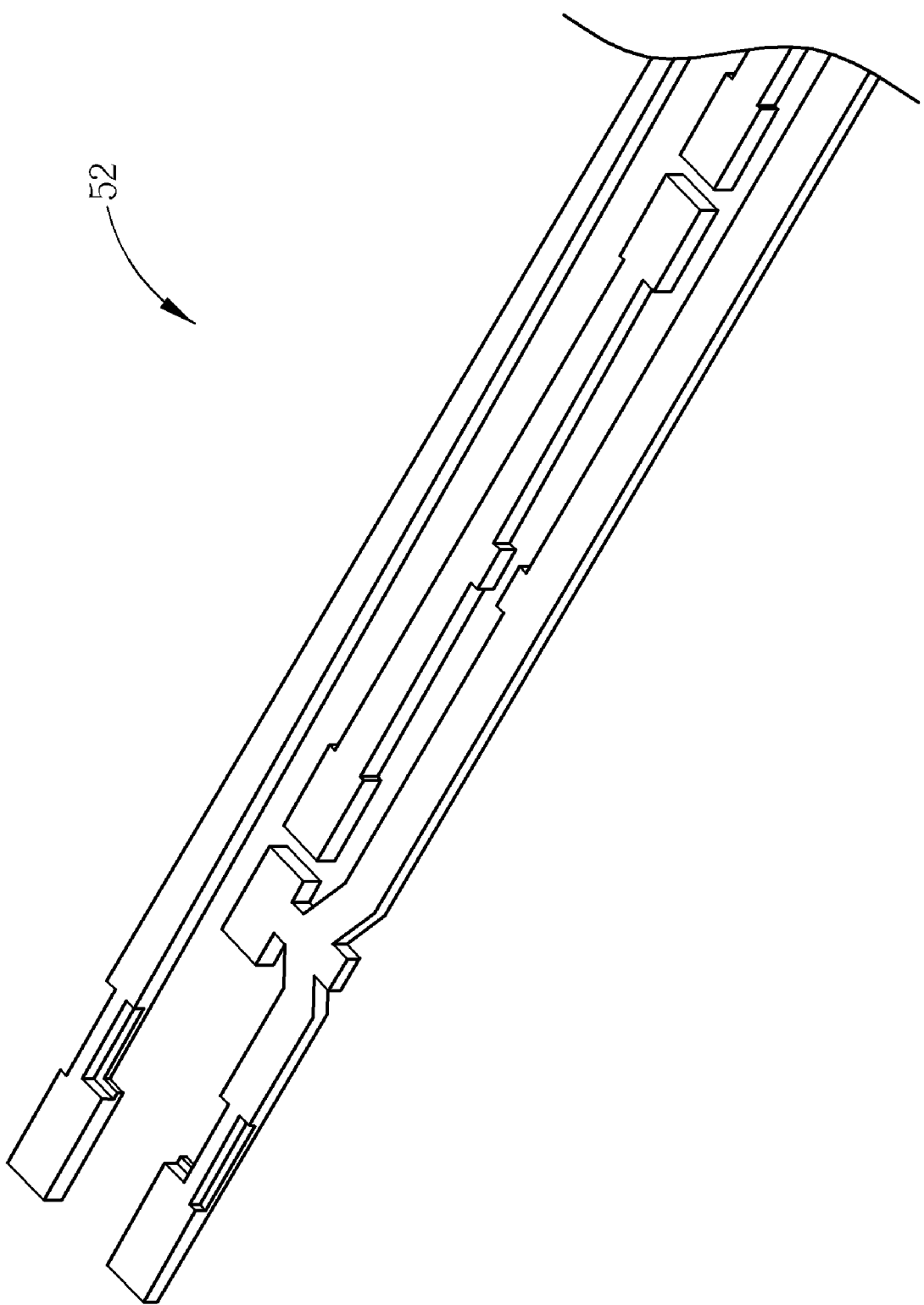
FIG. 12 is a partial diagram of a lead frame in FIG. 10.

Please refer to FIG. 11 and FIG. 12. FIG. 11 is a flowchart of a method for forming the LED module 50 according to the second preferred embodiment of the present invention. FIG. 12 is a partial diagram of the lead frame 52 in FIG. 10. The method involves packaging the plurality of LED chips 56 on the lead frame 52 and then respectively forming the plurality of lens structures 60 on the plurality of glue layers 58. The lead frame 52 mentioned in Step 1100 is depicted in FIG. 12. The lead frame 52 is used to connect the plurality of LED chips 56 to an external circuit board so that subsequent operations may be performed, such as light emitting control of the plurality of LED chips 56 or power supply for the plurality of LED chips 56.

Figure 13:
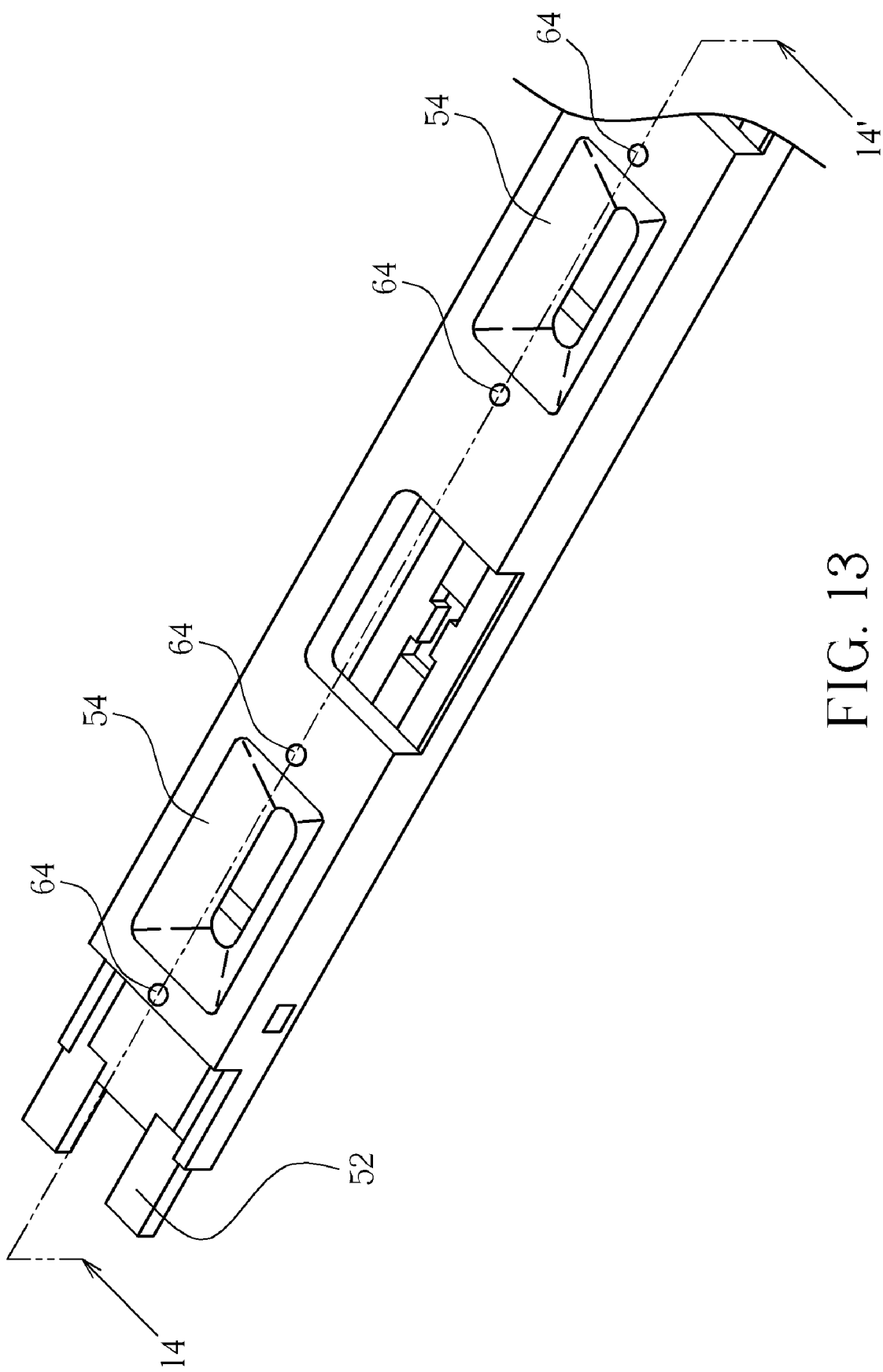
FIG. 13 is a partial diagram of reflection cup structures being formed on the lead frame in FIG. 12.

Next, please refer to FIG. 11 and FIG. 13 which is a partial diagram of the plurality of reflection cup structures 54 being formed on the lead frame 52 in FIG. 12. As shown in FIG. 13, after the lead frame 52 is formed by a mechanical punching process, the plurality of reflection cup structures 54 may also surround the lead frame 52 by the aforementioned injection molding process. For example, the lead frame 52 may be disposed in a mold corresponding to the shape of the plurality of reflection cup structures 54, and then the plurality of reflection cup structures 54 may be formed in the mold and associated with the lead frame 52 according to the aforementioned injection molding process. It should be mentioned that the formed reflection cup structures 54 may partially cover the lead frame 52 so as to secure the plurality of reflection cup structures 54 on the lead frame 52 more firmly.

Figure 14:
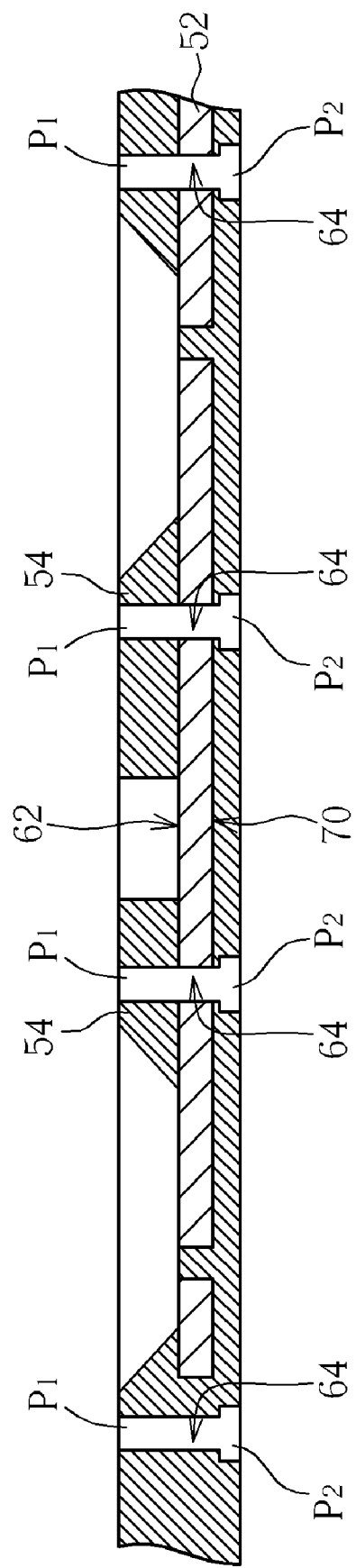
FIG. 14 is a partial cross-sectional diagram of the reflection cup structures in FIG. 13 along the cross-sectional line 14-14'.

Next, please refer to FIG. 13 and FIG. 14 which is a partial cross-sectional diagram of the plurality of reflection cup structures 54 in FIG. 13 along a cross-sectional line 14-14'. As shown in FIG. 13 and FIG. 14, a runner 64 is respectively formed at two sides of each reflection cup structure 54. The plurality of runners 64 may be formed within the reflection cup structures 54 simultaneously when the reflection cup structures 54 are formed by the aforementioned injection molding process, or may be formed by a common drilling process after the reflection cup structures 54 are formed on the lead frame 52. Furthermore, as shown in FIG. 14, the diameter of a first end $P_1$ of each runner 64 corresponding to a first plane 62 of the lead frame 52 is less than the diameter of a second end $P_2$ of each runner 64 corresponding to a second plane 70 of the lead frame 52, which is a so called "sink hole" structural design. Thus, in the subsequent process of forming the lens structures 60 on the glue layers 58, the melted thermoplastic transparent material may move along the said hole structure with different diameters in the runner 64 to form the fixing structure 61 with different diameters. In such a manner, connection of the fixing structures 61 and the runners 64 of the reflection cup structures 54 may cause connection of the lens structures 60 and the reflection cup structures 54 more firmly. In addition, the melted thermoplastic transparent material may also be injected into the runner 64 more easily by employing the large hole diameter design for the second end $P_2$ of the runner 64. However, the internal hole diameter design of the runner 64 is not limited to the said "sink hole" structure. For example, the hole diameter of the runner 64 may also be uniform for saving manufacturing cost. As for which hole diameter design is utilized, it depends on practical manufacturing needs.

Figure 15:
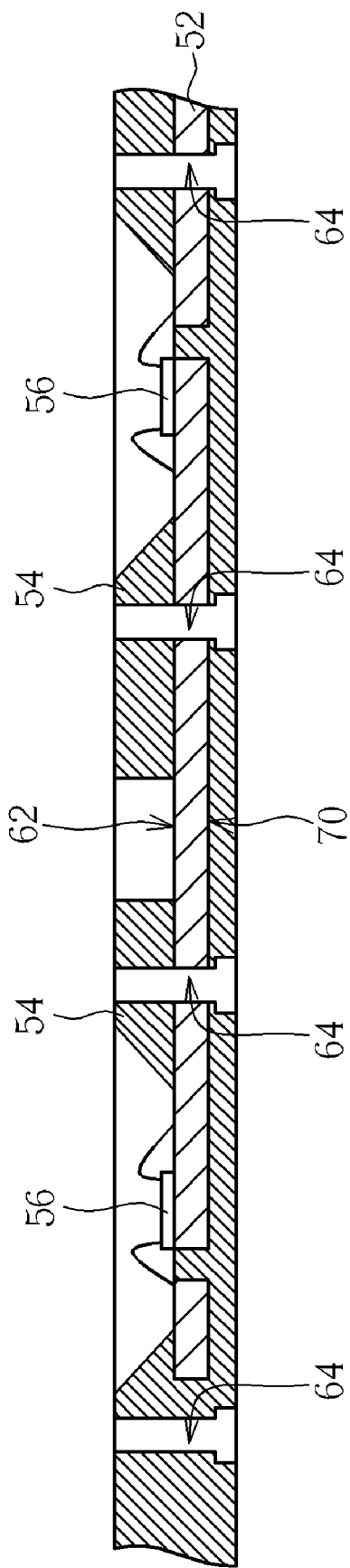
FIG. 15 is a partial cross-sectional diagram of LED chips being respectively installed within the reflection cup structures in FIG. 14.

Next, please refer to FIG. 11 and FIG. 15 which is a partial cross-sectional diagram of the plurality of LED chips 56 being respectively installed within the reflection cup structures 54 in FIG. 14. As shown in FIG. 15, after forming the plurality of reflection cup structures 54 on the lead frame 52 by the said injection molding process, the next step is to install the plurality of LED chips 56 within the plurality of reflection cup structures 54 and onto the first plane 62 of the lead frame 52 respectively (Step 1104). Similarly, the method for installing the plurality of LED chips 56 within the plurality of reflection cup structures 54 also may include electrically connecting the plurality of LED chips 56 and the first plane 62 of the lead frame 52 respectively by a wire bonding process, a flip-chip process, etc.

Figure 16:
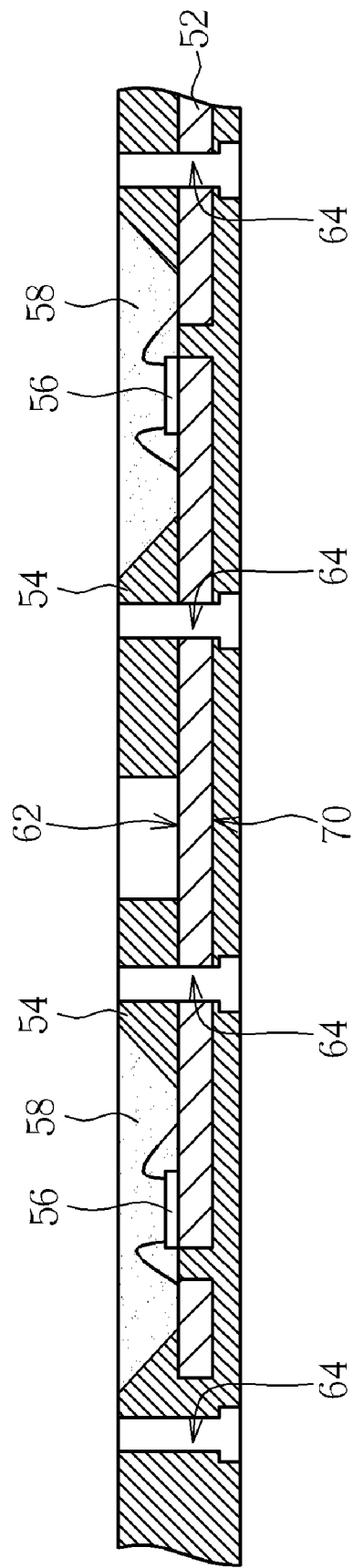
FIG. 16 is a partial cross-sectional diagram of glue layers being respectively formed in the reflection cup structures in FIG. 15.

Next, please refer to FIG. 11 and FIG. 16 which is a partial cross-sectional diagram of the plurality of glue layers 58 being respectively formed in the reflection cup structures 54 in FIG. 15. As shown in FIG. 16, transparent material (e.g. epoxy, silicone, etc.) is injected into the plurality of reflection cup structures 54 to form the plurality of glue layers 58, so as to package the LED chips 56 disposed in the reflection cup structures 54 on the lead frame 52. As mentioned above, in the process of injecting the transparent material, fluorescent powder may also be mixed into the transparent material for emitting light of specific wavelength. For example, YAG (Yttrium Aluminum Garnet, YAG) of fluorescent powder may excite by blue light emitted from an LED chip to generate white light.

Next, please refer to FIG. 11 and FIG. 17 which is a partial cross-sectional diagram of the lead frame 52 in FIG. 16 being disposed in the mold 66. As shown in FIG. 17, the lead frame 52 with the plurality of packaged LED chips 56 is disposed in the mold 66, and then the injection molding process is performed.

Figure 18:
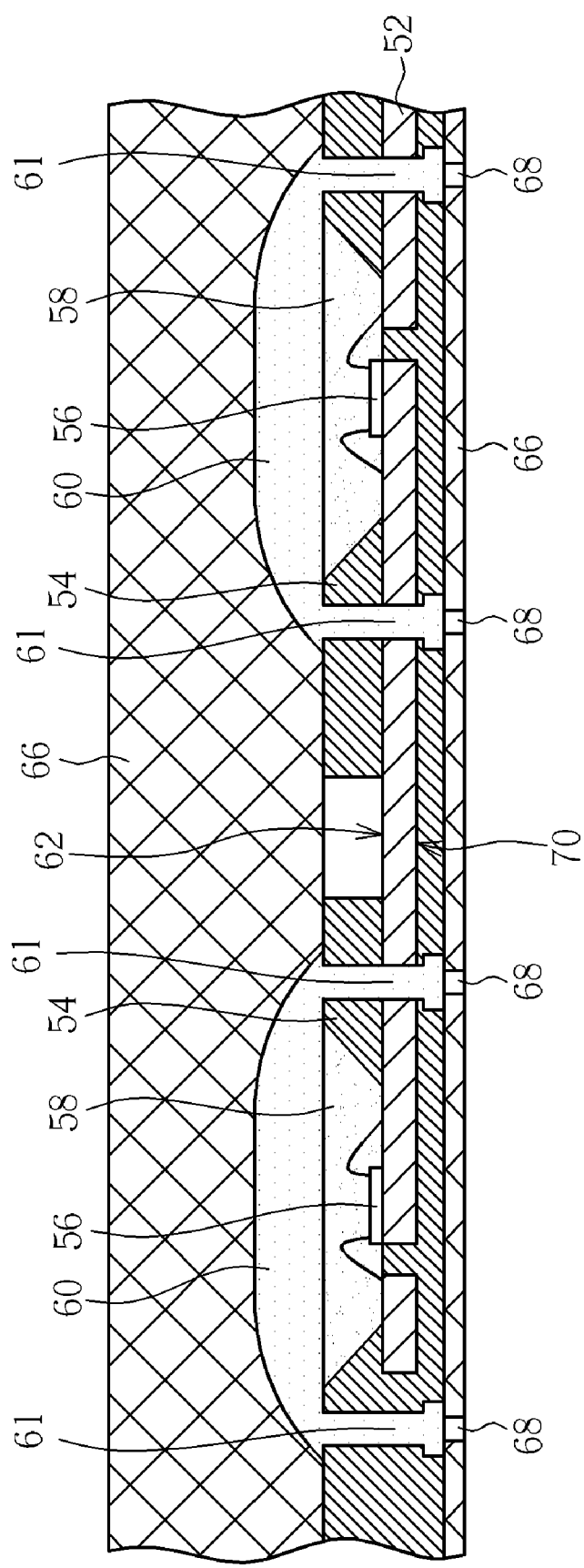
FIG. 18 is a partial cross-sectional diagram of lens structures and fixing structures being formed in the mold in FIG. 17.

Next, please refer to FIG. 11 and FIG. 18 which is a partial cross-sectional diagram of the lens structures 60 and the fixing structures 61 being formed in the mold 66 in FIG. 17. As shown in FIG. 18, the melted thermoplastic transparent material is injected to the second plane 70 of the lead frame 52 via a gate 68 of the mold 66 and then into the runners 64 of the reflection cup structures 54. Thus, the corresponding lens structures 60 may be formed on the glue layers 58 respectively and the fixing structures 61 may be formed in the runners 64 of the reflection cup structures 54 respectively. In a manner of the lens structures 60 being formed on the glue layers 58 and the fixing structures 61 passing through the lead frame 52 and being formed in the runners 64 of the reflection cup structures 54, association of the lens structures 60 and the reflection cup structures 54 may be more firm. Subsequently, the manufacturing process of the LED module 50 is completed after drawing out the lead frame 52 with lens structures 60 from the mold 66. As shown in FIG. 18, the aforementioned second plane 70 is (but is not limited to) a bottom surface of the lead frame 52. As a result, the LED chips 56 and the related circuits (such as wire thereon) may be protected from damage caused by direct scouring of the melted thermoplastic transparent material. In addition, the thermoplastic transparent material used in the present invention is preferably polycarbonate material. As for the injection molding process of the lens structure 60, the related description is omitted herein since it is similar to that of the lens structure 20.

Figure 19:
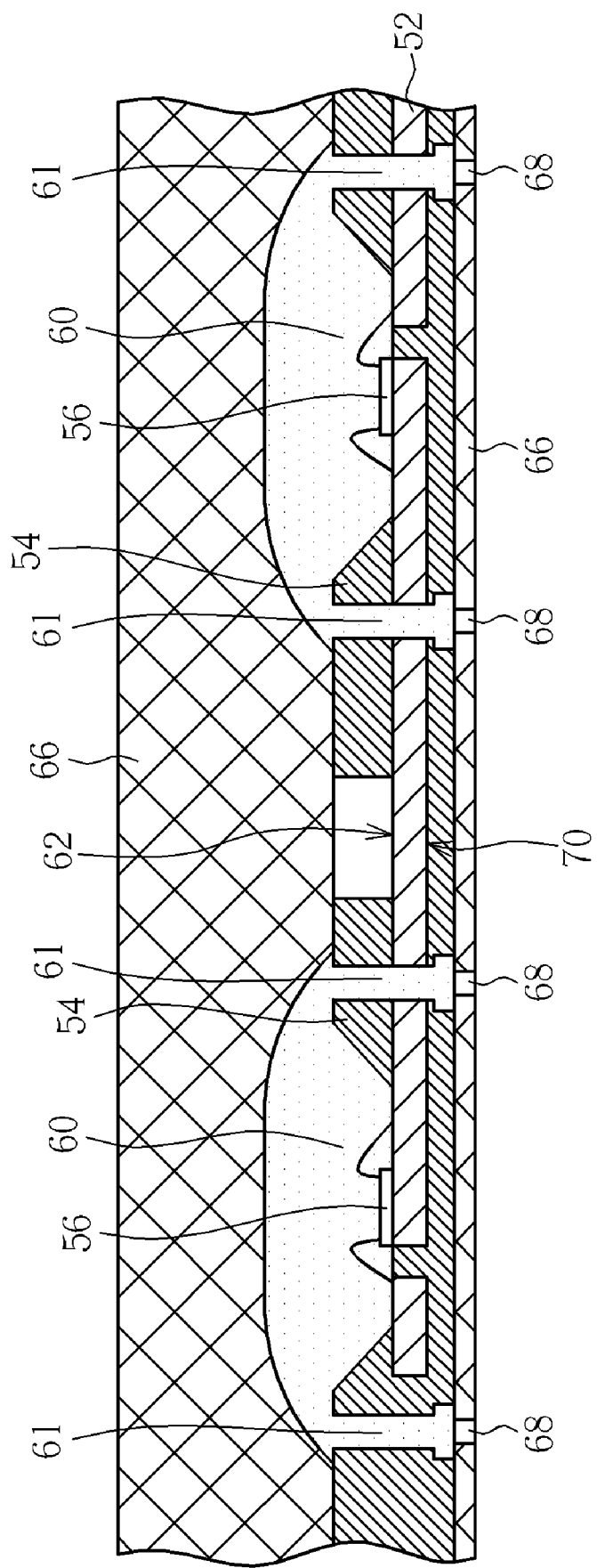
FIG. 19 is a partial cross-sectional diagram of the lens structures covering the LED chips.

Similarly, Step 1106 may also be an omissible step. Please refer to FIG. 19, which is a partial cross-sectional diagram of the lens structure 60 covering the LED chip 56. As shown in FIG. 19, after the plurality of LED chips 56 is installed within the plurality of reflection cup structures 54 and onto the first plane 62 of the lead frame 54 respectively, the lead frame 54 with the plurality of LED chips 56 is disposed in the mold 66 and a corresponding injection molding process is then performed. In such a manner, as shown in FIG. 19, the plurality of LED chips 56 may be packaged in the plurality of reflection cup structures 54 of the lead frame 52 by the plurality of lens structures 60 respectively instead of the plurality of glue layers 58, so that the manufacturing process of the LED module 50 may be simplified and the manufacturing cost of the LED module 50 may also be reduced.

Figure 20:
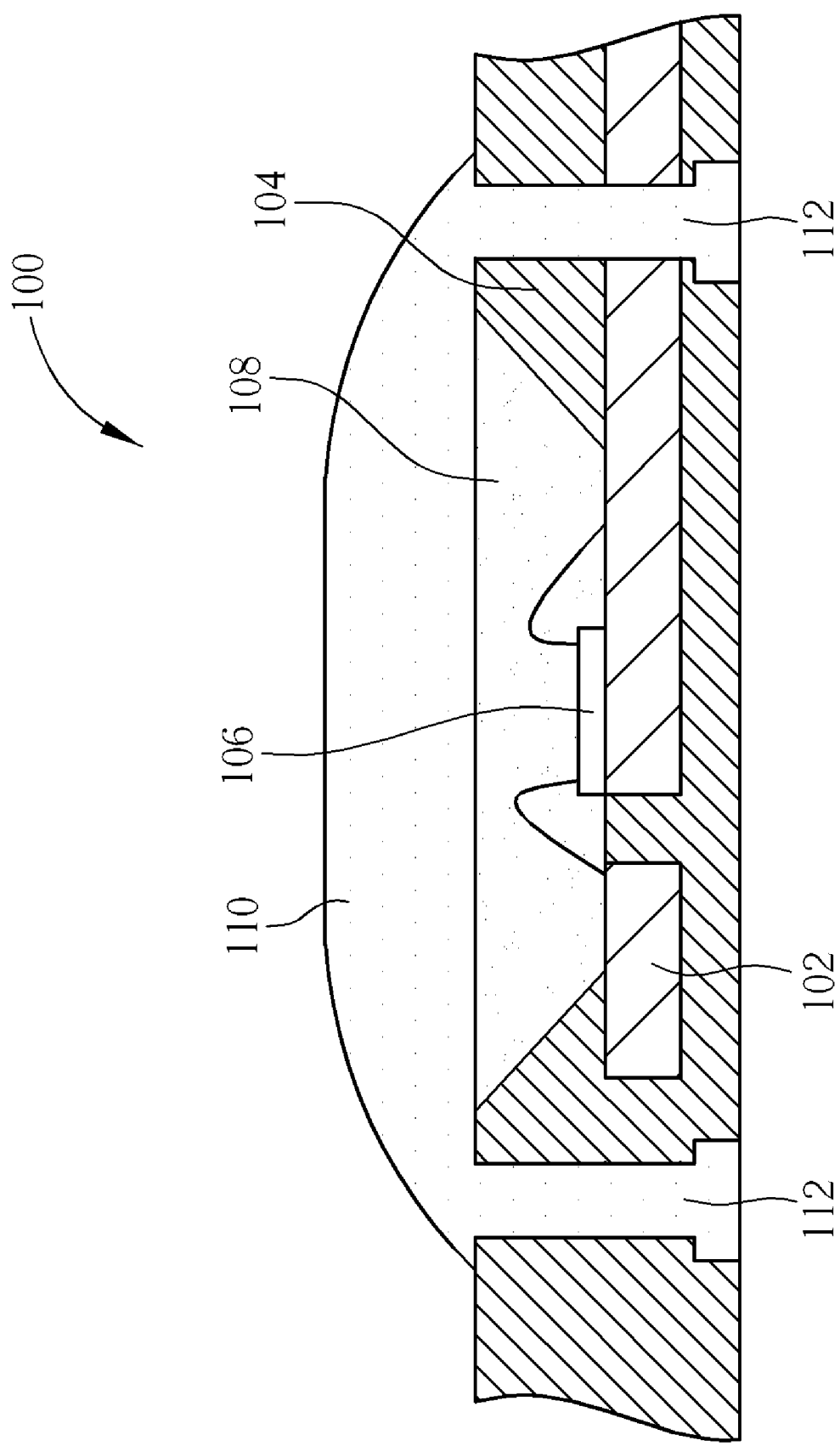
FIG. 20 is a partial cross-sectional diagram of the LED device according to a third preferred embodiment of the present invention.

Furthermore, as mentioned above, the lens structure forming method mentioned in the aforementioned embodiments of the present invention may also be applied to one single LED. For example, please refer to FIG. 20, which is a partial side view of an LED device 100 according to a third preferred embodiment of the present invention As shown in FIG. 20, the LED device 100 includes a lead frame 102, a reflection cup structure 104, an LED chip 106, a glue layer 108, and a lens structure 110. The reflection cup structure 104 is formed around the lead frame 102. The LED chip 106 is disposed within the reflection cup structure 104 and is electrically connected to the lead frame 102. The glue layer 108 is formed in the reflection cup structure 104 and covers the LED chip 106. The lens structure 110 is formed on the glue layer 108. A fixing structure 112 respectively located at two sides of the lens structure 110 passes through the lead frame 102 and the reflection cup structure 104 for fixing the lens structure 110 to the lead frame 102. There is an application difference between the third embodiment and the first and second embodiments. Compared with the first and second embodiments, which are applied to an LED light bar, the LED device 100 mentioned in the third embodiment is preferably applied to an SMD (Surface Mounted Device) LED. As for the manufacturing process of the LED device 100, the related description is omitted herein for simplicity since it is similar to the manufacturing processes mentioned in the first and the second embodiments. In addition, the manufacturing principles mentioned in the first and the second embodiments may also be applied to the third embodiment, such as packaging an LED chip within a reflection cup structure by a lens structure instead of a glue layer.

Furthermore, in the present invention, the structural design of the lead frame 12/52 is not limited to the structure as shown in FIGS. 3 and 12, meaning that it may vary with practical applications. For example, the lead frame 12/52 may also be changed to another structure, in which a plurality of lead frames is arranged side by side so that the plurality of LED chips 16/56 may be electrically connected to each other in a series/parallel connection manner. As a result, the plurality of LED chips 16/56 may be capable of emitting light cooperatively in an array manner so as to produce a surface light source.

The present invention involves utilizing an injection molding process to inject thermoplastic transparent material into a place of a lead frame that no LED chip is directly mounted on to form a lens structure above an LED chip. Furthermore, the present invention also utilizes a fixing structure to pass through or to cover the lead frame for fixing the formed lens structure to the lead frame. In such a manner, not only process time for forming a lens structure may be reduced, but the lens structure may also be formed above an LED chip without additional installation. Furthermore, the LED chips and the wire thereon may also be protected from damage caused by the related lens molding process.

Those skilled in the art will readily observe that numerous modifications and alterations of the device and method may be made while retaining the teachings of the invention.

What is claimed is:

1. A method for manufacturing an LED lens structure, the method comprising:

providing a lead frame;

installing at least one LED chip onto a first plane of the lead frame;

disposing the lead frame with the LED chip in a mold; and injecting thermoplastic transparent material to a second plane of the lead frame opposite to the first plane via a gate of the mold using an injection molding process to form a lens structure corresponding to the LED chip.

2. The method of claim 1, wherein the lead frame is formed by a mechanical punching process.

3. The method of claim 1 further comprising:

forming a reflection cup structure on the lead frame after providing the lead frame; and installing the LED chip within the reflection cup structure and onto the first plane of the lead frame.

4. The method of claim 3 further comprising:

injecting a glue layer into the reflection cup structure to package the LED chip onto the lead frame.

5. The method of claim 4, wherein the step of forming the reflection cup structure on the lead frame further comprises forming at least one runner within the reflection cup structure, and then injecting the thermoplastic transparent material through the runner to form the lens structure onto the glue layer.

6. The method of claim 5, wherein the diameter of a first end of the runner corresponding to the first plane of the lead frame is less than the diameter of a second end of the runner corresponding to the second plane of the lead frame.

7. The method of claim 3, wherein the step of forming the reflection cup structure on the lead frame further comprises forming at least one runner within the reflection cup structure, and then injecting the thermoplastic transparent material through the runner to form the lens structure onto the reflection cup structure.

8. The method of claim 7, wherein the diameter of a first end of the runner corresponding to the first plane of the lead frame is less than the diameter of a second end of the runner corresponding to the second plane of the lead frame.

9. The method of claim 3, wherein the step of injecting thermoplastic transparent material further comprises forming at least one fixing structure associated with the lead frame for fixing the corresponding lens structure on the reflection cup structure and the lead frame.

\* \* \* \* \*